US008941005B2

(12) United States Patent
Ohmi

(10) Patent No.: US 8,941,005 B2
(45) Date of Patent: Jan. 27, 2015

(54) PHOTOELECTRIC CONVERSION DEVICE

(75) Inventor: Tadahiro Ohmi, Sendai (JP)

(73) Assignee: National University Corporation Tohoku University, Miyagi (JP)

( * ) Notice: Subject to any disclaimer, the term of this patent is extended or adjusted under 35 U.S.C. 154(b) by 30 days.

(21) Appl. No.: 13/383,660

(22) PCT Filed: Jul. 26, 2010

(86) PCT No.: PCT/JP2010/062488
§ 371 (c)(1),
(2), (4) Date: Jan. 12, 2012

(87) PCT Pub. No.: WO2011/013599
PCT Pub. Date: Feb. 3, 2011

(65) Prior Publication Data
US 2012/0111394 A1   May 10, 2012

(30) Foreign Application Priority Data

Jul. 31, 2009   (JP) ................................ 2009-179181

(51) Int. Cl.
*H01L 31/06* (2012.01)
*H01L 31/052* (2014.01)
(Continued)

(52) U.S. Cl.
CPC .......... *H01L 31/052* (2013.01); *H01L 27/1423* (2013.01); *H01L 31/02167* (2013.01); *H01L 31/075* (2013.01); *Y02E 10/548* (2013.01)
USPC ............ 136/259; 136/246; 136/258; 136/261

(58) Field of Classification Search
CPC ............ H01L 31/06; H01L 31/022425; H01L 31/042; H01L 31/022441; H01L 31/0224; H01L 2924/10253; H01L 21/4871; H01L 31/052; H01L 31/075; Y02E 10/547; Y02E 10/548; Y02E 10/545

USPC .............. 136/224–225, 232, 236.1, 239, 241, 136/243, 246, 252, 258, 259, 261, 265, 206, 136/244, 251

See application file for complete search history.

(56) References Cited

U.S. PATENT DOCUMENTS 5,311,060 A * 5/1994 Rostoker et al. .............. 257/796
5,380,371 A    1/1995 Murakami
(Continued)

FOREIGN PATENT DOCUMENTS

CN     102455444 A      5/2012
EP     2093803 A1 *    8/2009
(Continued)

OTHER PUBLICATIONS

Vetter et al. "IR-study of a-SiCx:H and a-SiCxNy:H films for c-Si surface passivation" Thin Solid Films 451-452 (2004) 340-344.*
(Continued)

*Primary Examiner* — Susan D Leong
(74) *Attorney, Agent, or Firm* — Morgan, Lewis & Bockius LLP

(57) ABSTRACT

It is an object of the present invention to provide a photoelectric conversion device having a passivation layer suitable for a structure provided with a heat dissipation mechanism. A photoelectric conversion device 1 of the present invention has a first electrode layer 20, a single power generation laminate 22 having a nip structure formed of a-Si (amorphous silicon), and a second electrode layer 26 of Al formed on the power generation laminate 22 through a nickel layer 24. On the second electrode layer 26, a passivation layer 28 constructed of a material containing SiCN is formed. On the passivation layer 28, a heat sink 30 (for example, formed of Al) is mounted through an adhesive layer 29.

7 Claims, 3 Drawing Sheets

(51) Int. Cl.
*H01L 31/075* (2012.01)
*H01L 27/142* (2014.01)
*H01L 31/0216* (2014.01)

(56) References Cited

U.S. PATENT DOCUMENTS

| | | | |
|---|---|---|---|
| 5,391,896 A * | 2/1995 | Wanlass | 257/80 |
| 5,736,431 A * | 4/1998 | Shinohara et al. | 438/96 |
| 5,811,348 A | 9/1998 | Matsushita et al. | |
| 5,935,705 A * | 8/1999 | Chen et al. | 428/367 |
| 2002/0064906 A1 | 5/2002 | Enquist | |
| 2002/0179143 A1* | 12/2002 | Haussler et al. | 136/265 |
| 2004/0191950 A1* | 9/2004 | Nakamura et al. | 438/98 |
| 2005/0077601 A1* | 4/2005 | Yu et al. | 257/675 |
| 2008/0006320 A1 | 1/2008 | Magnussen Aas et al. | |
| 2008/0067546 A1* | 3/2008 | Murata et al. | 257/192 |
| 2008/0186788 A1* | 8/2008 | Barth | 365/225.7 |
| 2008/0223429 A1 | 9/2008 | Everett et al. | |
| 2010/0065115 A1 | 3/2010 | Yata | |
| 2010/0275981 A1 | 11/2010 | Ohmi et al. | |
| 2011/0253208 A1 | 10/2011 | Ohmi | |
| 2012/0186638 A1* | 7/2012 | Ohmi | 136/255 |

FOREIGN PATENT DOCUMENTS

| | | |
|---|---|---|
| JP | 58-215083 | 12/1983 |
| JP | 8-213645 | 8/1996 |
| JP | 11-040834 | 2/1999 |
| JP | 2003-069070 | 3/2003 |
| JP | 2003-142712 | 5/2003 |
| JP | 2003-528466 | 9/2003 |
| JP | 2008-509564 | 3/2008 |
| JP | 2008-140920 | 6/2008 |
| JP | 2010-141121 | 6/2010 |
| TW | 200905903 A | 2/2009 |
| WO | WO 2008065970 A1 * | 6/2008 |
| WO | 2009/078153 | 6/2009 |

OTHER PUBLICATIONS

Tomasella et al., Structural and Optical Properties Studies of Sputtered a-SiCN Thin Films, Journal of Physics: Conference Series 100, pp. 1-4, (2008).

German Office Action dated Sep. 13, 2012 for corresponding Patent Application No. 11 2010 003 152.5.

Office Action dated Dec. 26, 2013 in the corresponding Chinese Patent Application No. 201080032318.8 and an English-language translation of relevant part of the Chinese Office Action.

* cited by examiner

PHOTOELECTRIC CONVERSION DEVICE

This is a U.S. National Phase Entry of PCT Application No. PCT/JP2010/062488, filed Jul. 26, 2010, and claims the benefit of Japanese Patent Application No. 2009-179181, filed Jul. 31, 2009.

TECHNICAL FIELD

This invention relates to a photoelectric conversion device.

BACKGROUND ART

In recent years, it has been proposed to use a solar energy as an alternative energy that substitutes for the thermal or the hydraulic power. Therefore, expectation for a solar cell constructed by a photoelectric conversion element for converting the solar energy into an electric energy becomes very great.

Under the circumstances, there have been proposed various types of solar cells or photoelectric conversion elements, such as silicon-based, compound-based, and organic-based solar cells or photoelectric conversion elements.

Further, among the solar cells of these types, the silicon-based solar cells use, as their material, silicon which is an abundant resource on earth. Therefore, it is considered that the problem of resource exhaustion or the like does not arise as compared with the compound-based and the organic-based solar cells as the other types.

Among the silicon-based solar cells, in a case of an amorphous type silicon solar cell, a film thickness of an amorphous silicon (a-Si) film can be reduced to $1/100$ or less as compared with monocrystalline type and polycrystalline type silicon solar cell. Therefore, the amorphous type is suitable for actually manufacturing high-power and large-area solar cell at a low cost.

However, the amorphous type silicon solar cell has an energy conversion efficiency of about 6% which is significantly low as compared with the monocrystalline type and the polycrystalline type silicon solar cells having an energy conversion efficiency of about 20%. In addition, it is pointed out that the energy conversion efficiency of the amorphous type silicon solar cell decreases with an increase of its area.

The present inventors previously proposed, in Patent Document 1, an amorphous type silicon solar cell or photoelectric conversion element having an energy conversion efficiency exceeding 6%. The proposed amorphous type silicon solar cell or photoelectric conversion element includes a first electrode layer formed of a transparent electrode, a second electrode layer, and one or a plurality of power generation laminates provided between the first and the second electrode layers. The power generation laminate has a so-called nip structure comprising an n-type amorphous semiconductor layer (in particular, n-type amorphous silicon layer) formed in contact with the first electrode layer, a p-type amorphous semiconductor layer (in particular, p-type amorphous silicon layer) formed in contact with the second electrode layer, and an i-type semiconductor layer (i-type silicon layer) provided between the n-type amorphous semiconductor layer and the p-type semiconductor layer.

In order to increase the conversion efficiency, it is also proposed to use a light-emitting laminate of a nip structure formed of microcrystalline silicon (μC-Si) which consumes a relatively small amount of silicon (Patent Document 2).

Further, the amorphous type solar cell or photoelectric conversion element described in Patent Document 1 adopts, as the first electrode layer brought into contact with the n-type amorphous silicon layer as the n-type amorphous semiconductor layer, a transparent electrode using $n^+$-type ZnO with a low energy barrier.

PRIOR ART DOCUMENTS

Patent Documents

Patent Document 1: JP Patent Application No. 2008-315888
Patent Document 2: JP-A-2003-142712

SUMMARY OF THE INVENTION

Problem to be Solved by the Invention

The amorphous type solar cell or photoelectric conversion element disclosed in Patent Document 1 is mass-producible and can achieve an energy conversion efficiency of 10% or more. Further, the amorphous type solar cell or photoelectric conversion element is constructed of silicon and zinc materials free from the problem of resource exhaustion or the like. Therefore, possibility of large-scale and high-volume production of the solar cell in the future is expected. Hereinbelow, for simplification of explanation, a power-generation structure including the solar cell and/or the photoelectric conversion element will collectively be referred to as a photoelectric conversion device.

It is noted here that the photoelectric conversion device generally has a characteristic that a power-generation efficiency is reduced with an increase of a temperature. When the temperature is increased by 1° C., for example, an a-Si solar cell is reduced in efficiency by 0.22% while a monocrystalline Si solar cell is reduced in efficiency by 0.45%.

Therefore, the photoelectric conversion device is sometimes provided with a heat dissipation mechanism, such as a metal heat sink, on the side of one electrode layer.

In this event, it is necessary to provide the electrode layer with a passivation layer (protective layer) in order to prevent oxidation of the electrode layer, diffusion of an element from a semiconductor layer, electric conduction with other members, such as the heat sink, and so on. The passivation layer is required not only to prevent the above-mentioned matters but also to have a strength itself and a physical property which does not obstruct heat dissipation.

In view of the above, the present invention has been made. It is a technical object of the present invention to provide a photoelectric conversion device having a passivation layer suitable for a structure provided with a heat dissipation mechanism.

Means to Solve the Problem

In order to solve the above-mentioned problem, according to a first aspect of this invention, there is provided a photoelectric conversion device comprising a photoelectric conversion element for converting an energy of incident light into an electric energy, and a heat dissipation portion provided to the photoelectric conversion element, characterized in that the photoelectric conversion element has a passivation layer provided in a portion brought into contact with the heat dissipation portion and constructed of a material containing SiCN.

According to a second aspect of this invention, there is provided the photoelectric conversion device set forth in the first aspect, characterized in that the photoelectric conversion element includes a first electrode layer, a second electrode layer, and one or a plurality of power generation laminates provided between the first and the second electrode layers, the power generation laminate including a p-type semiconductor layer, an i-type semiconductor layer formed in contact with the p-type semiconductor layer, and an n-type semiconductor layer formed in contact with the i-type semiconductor layer, the passivation layer being provided to the second electrode layer.

According to a third aspect of this invention, there is provided the photoelectric conversion device set forth in the second aspect, characterized in that the first electrode layer is a transparent electrode.

According to a fourth aspect of this invention, there is provided the photoelectric conversion device set forth in any one of the first to the third aspects, characterized in that the i-type semiconductor layer of the power generation laminate is formed of any one of crystalline silicon, microcrystalline amorphous silicon, and amorphous silicon.

According to a fifth aspect of this invention, there is provided the photoelectric conversion device set forth in any one of the first to the fourth aspects, characterized in that the first electrode layer has a portion which is brought into contact with the n-type semiconductor layer and which contains n-type ZnO, the n-type semiconductor layer brought into contact with the first electrode layer being formed of amorphous silicon.

According to a sixth aspect of this invention, there is provided the photoelectric conversion device set forth in any one of the first to the fifth aspects, characterized in that the p-type semiconductor layer brought into contact with the second electrode layer is formed of amorphous silicon, the second electrode layer being provided with a layer containing nickel (Ni) at least in a portion brought into contact with the p-type semiconductor layer.

According to a seventh aspect of this invention, there is provided the photoelectric conversion device set forth in any one of the first to the sixth aspects, characterized in that the heat dissipation portion is a heat sink constructed of a material containing Al.

According to an eighth aspect of this invention, there is provided the photoelectric conversion device set forth in any one of the first to the seventh aspects, characterized in that SiCN has a composition containing silicon nitride ($Si_3N_4$) and C added thereto in an amount of 2 at % to 40 at %.

Effect of the Invention

In the present invention, it is possible to provide a photoelectric conversion device having a passivation layer suitable for a structure provided with a heat dissipation mechanism.

MODE FOR EMBODYING THE INVENTION

Figure 1:
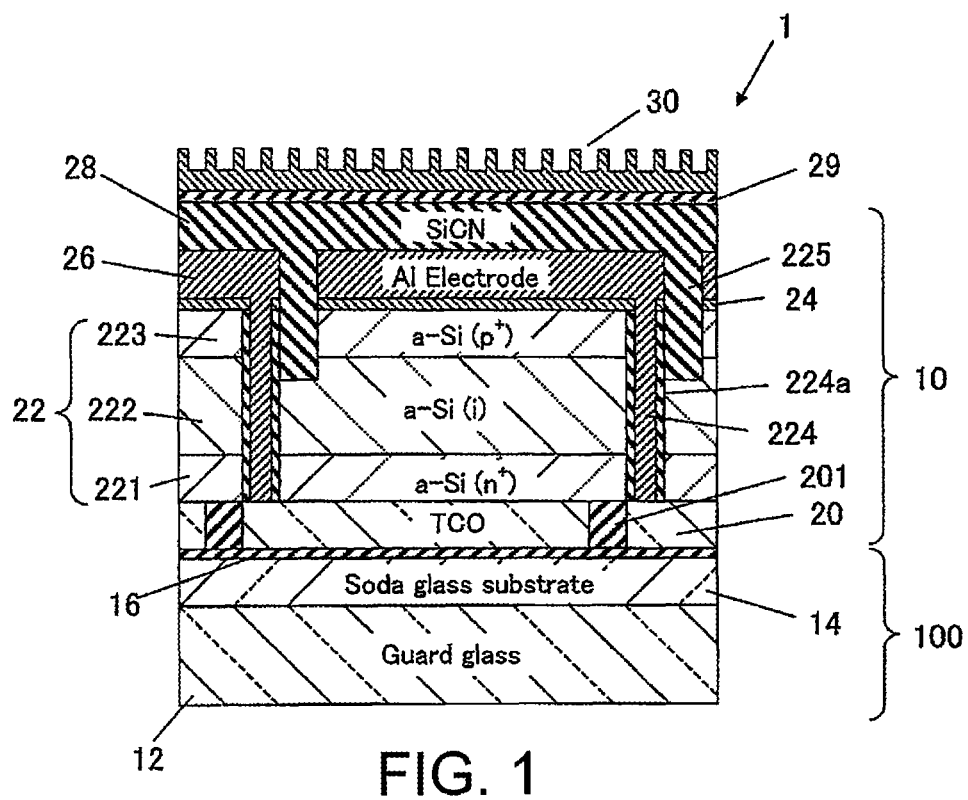
FIG. 1 is a sectional view of a photoelectric conversion device 1.

Referring to FIG. 1, a photoelectric conversion device according to an embodiment of the present invention will be described. The photoelectric conversion device 1 illustrated in the figure includes a plurality of photoelectric conversion elements 10 and a heat sink 30 provided to the photoelectric conversion elements 10 as a heat dissipation portion. By connecting a plurality of photoelectric conversion elements 10, a solar cell module is constructed. The illustrated photoelectric conversion elements 10 are formed on a base member 100 including a guard glass 12, a glass substrate 14 disposed on the guard glass 12, and a sodium barrier layer 16 formed on the glass substrate 14.

In this example, the glass substrate 14 is formed of an inexpensive soda glass containing Na. For the purpose of preventing contamination of the elements due to diffusion of Na from the soda glass, the sodium barrier layer 16 is formed on the glass substrate 14. The sodium barrier layer 16 is formed by, for example, applying a surface flattening coating liquid, drying, and sintering. As apparent from the figure, each photoelectric conversion element 10 as a unit cell is electrically connected in series to another adjacent photoelectric conversion element (cell) on the base member 100.

Specifically, each photoelectric conversion element 10 according to one embodiment of the present invention comprises a first electrode layer 20, a single power generation laminate 22 having a nip structure formed of a-Si (amorphous silicon), a second electrode layer 26 formed on the power generation laminate 22 through a nickel layer 24 (layer containing Ni) and constructed of a material containing Al, and a passivation layer 28 constructed of a material containing SiCN.

The first electrode layer 20 constructing the photoelectric conversion element 10 is a transparent conductor electrode (Transparent Conductive Oxide (TCO) layer) and, herein, is formed of a ZnO layer having a film thickness of 1 μm (at least a portion brought into contact with an n-type semiconductor layer contains n-type ZnO). The first electrode layer 20 (ZnO layer) is a Ga-doped $n^+$-type ZnO layer. The $n^+$-type ZnO layer constructing the first electrode layer 20 is provided with insulating layers 201 (herein, of a material containing SiCN) which are formed at predetermined intervals and is divided and sectionalized cell by cell.

On the first electrode layer 20, an $n^+$-type a-Si layer 221 constructing a part of the power generation laminate 22 is formed. The $n^+$-type a-Si layer 221 is brought into contact with the transparent electrode constructing the first electrode layer 20. The illustrated $n^+$-type a-Si layer 221 has a film thickness of 10 nm. On the $n^+$-type a-Si layer 221, an i-type a-Si layer 222 and a $p^+$-type a-Si layer 223 constructing the power generation laminate 22 are successively formed. The i-type a-Si layer 222 and the $p^+$-type a-Si layer 223 illustrated in the figure have film thicknesses of 480 nm and 10 nm, respectively.

In this example, the $n^+$-type a-Si layer 221, the i-type a-Si layer 222, and the $p^+$-type a-Si layer 223 constructing the power generation laminate 22 are provided with via holes 224 formed at positions different from those of the insulating layers 201 of the first electrode layer 20. Each of the via holes has an inner wall provided with a $SiO_2$ layer 224a formed thereon.

The power generation laminate 22 of a nip structure has a thickness of 500 nm in total and thus has a thickness of 1/100 or less as compared to a photoelectric conversion element formed of monocrystalline or polycrystalline silicon.

Next, on the $p^+$-type a-Si layer 223, the second electrode layer 26 is formed through the nickel layer 24 (the nickel layer 24 is formed on the second electrode layer 26 at least in a portion brought into contact with the $p^+$-type a-Si layer 223).

The second electrode layer 26 is formed also inside each via hole 224 (whose inner wall is insulated by the $SiO_2$ layer 224a) of the power generation laminate 22. The second electrode layer 26 inside the via hole 224 is electrically connected to the first electrode layer 20 of the adjacent photoelectric conversion element.

Further, on the second electrode layer 26, the passivation layer 28 constructed of SiCN is formed. An insulating material (herein, SiCN) forming the passivation layer 28 is also buried in holes 225 which pass through the second electrode layer 26, the nickel layer 24, and the $p^+$-type a-Si layer 223 to reach the i-type a-Si layer 222. On the passivation layer 28, the heat sink 30 (formed of, for example, a material containing Al) is mounted through an adhesive layer 29 formed of a material excellent in thermal conductivity.

The $n^+$ ZnO layer forming the first electrode layer 20 may be formed by doping Al, In, or the like instead of Ga.

Herein, SiCN which is a material of the passivation layer 28 has a characteristic that the thermal conductivity is excellent as compared to other passivation layers of, for example, $SiO_2$ and the like. $SiO_2$, which is conventionally used for the passivation layer, has a thermal conductivity of 1.4 W/m/Kelvin. In contrast, SiCN has an overwhelmingly large thermal conductivity of 70 W/m/Kelvin and can efficiently conduct heat to the heat sink 30 through the high-thermal-conductivity adhesive layer 29 (in the present embodiment, having a high thermal conductivity of 25 W/m/Kelvin by mixing a carbon nanotube with a plastic excellent in thermal conductivity). Therefore, it is possible to prevent reduction in power generation efficiency due to an increase in heat of a solar cell.

Further, SiCN hardly allows hydrogen to pass therethrough as compared to other passivation layers formed of, for example, $SiO_2$ and the like. Therefore, it is possible to prevent degradation of the characteristics of a solar cell due to detachment of hydrogen from silicon (which is generally hydrogen-terminated) constructing the power generation laminate 22. Especially, in a case of using an a-Si film, hydrogen terminating dangling-bonds on a surface of an a-Si layer is detached at about 300° C. Therefore, SiCN capable of suppressing hydrogen release is significantly effective.

Furthermore, as will later be described, SiCN can be reduced in internal stress to substantially zero by adjusting film forming conditions. Therefore, it is possible to prevent peeling caused by the passivation layer and degradation of electrical characteristics due to thermal stress applied to the element.

With the photoelectric conversion element 10, an energy conversion efficiency of about 20% was obtained by a single cell of the photoelectric conversion element 10. When a solar cell module having a size of 1.15 m×1.40 m is constructed by connecting the photoelectric conversion elements 10, an electric power of 307 W was obtained and an energy conversion efficiency of the module was 18.9%.

Hereinbelow, referring to FIGS. 2A to 2H, a method of manufacturing the photoelectric conversion element 10 and the photoelectric conversion device 1 illustrated in FIG. 1 will be described. In this example, description will be made about a case of using a system in which MSEP (Metal Surface-wave Excited Plasma) type plasma processing apparatuses (with or without a lower gas nozzle or a lower gas shower plate) proposed in the specification of Japanese Patent Application No. 2008-153379, which was previously filed by the present inventors, are used as first to eighth plasma processing apparatuses and these plasma processing apparatuses are arranged in a cluster shape.

Figure 2A:
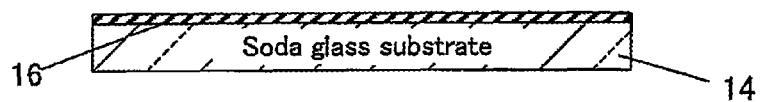
FIG. 2A is a view for describing a manufacturing method of a photoelectric conversion element 10.

As shown in FIG. 2A, at first, on the glass substrate 14 formed of soda glass, the sodium barrier layer 16 having a thickness of 0.2 μm is formed in a low-pressure atmosphere of about 5 Torr.

Figure 2B:
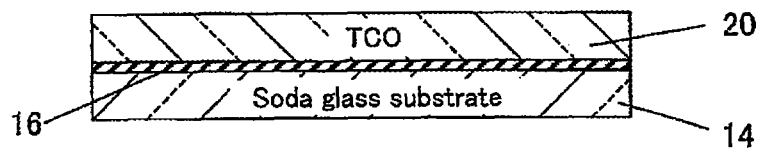
FIG. 2B is a view for describing the manufacturing method of the photoelectric conversion element 10.

Next, as shown in FIG. 2B, the glass substrate 14 with the sodium barrier layer 16 formed thereon is introduced into the first plasma processing apparatus provided with the lower gas nozzle or the lower gas shower plate and a transparent electrode (TCO layer) having a thickness of 1 μm is formed as the first electrode layer 20. In the first plasma processing apparatus, the $n^+$-type ZnO layer is formed by doping Ga. The Ga-doped $n^+$-type ZnO layer is formed as follows. In the first plasma processing apparatus, a mixed gas of Kr and $O_2$ is supplied from an upper gas nozzle to a chamber to generate a plasma and a mixed gas of Ar, $Zn(CH_3)_2$, and $Ga(CH_3)_3$ is jetted from the lower gas nozzle or the lower gas shower plate into the plasma generated in an atmosphere containing Kr and oxygen. As a consequence, the $n^+$-type ZnO layer is formed on the sodium barrier layer 16 by plasma CVD.

Figure 2C:
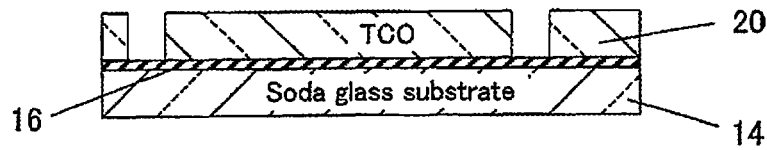
FIG. 2C is a view for describing the manufacturing method of the photoelectric conversion element 10.

Subsequently, on the $n^+$-type ZnO layer (first electrode layer 20), a photoresist is applied. Thereafter, the photoresist is patterned by using a photolithography technique. After the photoresist is patterned, the glass substrate is introduced into the second plasma processing apparatus provided with the lower gas nozzle or the lower gas shower plate. In the second plasma processing apparatus, using the patterned photoresist as a mask, the $n^+$-type ZnO layer is selectively etched to form, in the $n^+$-type ZnO layer constructing the first electrode layer 20, openings reaching the sodium barrier layer 16 as shown in FIG. 2C. The etching in the second plasma processing apparatus is performed by supplying an Ar gas from the upper gas nozzle to the chamber and supplying, into a plasma generated in an Ar atmosphere, a mixed gas of Ar, $Cl_2$, and HBr supplied from the lower gas nozzle or the lower gas shower plate to the chamber.

The glass substrate 14 provided with the $n^+$-type ZnO layer having the openings and the photoresist applied onto the $n^+$-type ZnO layer is conveyed to the third plasma processing apparatus without the lower gas nozzle or the lower gas shower plate. In the third plasma processing apparatus, the photoresist is removed by ashing in a $Kr/O_2$ plasma atmosphere.

After the photoresist is removed, the glass substrate 14 to which the $n^+$-type ZnO layer (first electrode layer 20) having the openings is adhered is introduced into the fourth plasma processing apparatus provided with the lower gas nozzle or the lower gas shower plate. In the fourth plasma processing apparatus, SiCN as the insulating layer 201 is first formed in the openings and on a surface of the $n^+$-type ZnO layer (first electrode layer 20) by plasma CVD. Thereafter, SiCN on the surface of the $n^+$-type ZnO layer (first electrode layer 20) is removed by etching in the same fourth plasma processing apparatus. As a result, the insulating layer 201 is buried only in the openings of the $n^+$ ZnO layer (first electrode layer 20). The film formation of SiCN in the fourth plasma processing apparatus is performed by supplying Xe and $NH_3$ gases from the upper gas nozzle into the chamber to generate a plasma and introducing a mixed gas of Ar, $SiH_4$, and $SiH(CH_3)_3$ from the lower gas nozzle or the lower gas shower plate into the chamber to carry out film formation by CVD. Next, in the same chamber, the introduced gases are changed. An Ar gas is supplied from the upper gas nozzle into the chamber to generate a plasma and a mixed gas of Ar and $CF_4$ is introduced from the lower gas nozzle or the lower gas shower plate into the chamber to remove SiCN on the surface of the $n^+$-type ZnO layer (first electrode layer 20) by etching.

Figure 2D:
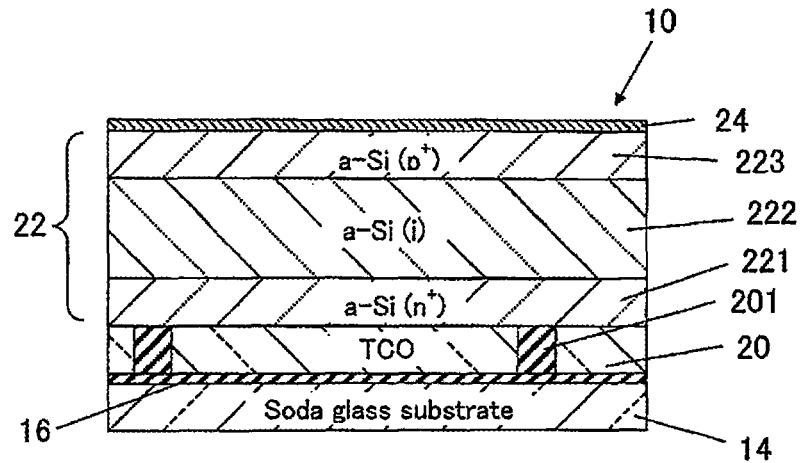
FIG. 2D is a view for describing the manufacturing method of the photoelectric conversion element 10.

Subsequently, in the same fourth plasma processing apparatus, the introduced gases are sequentially changed. Thus, the power generation laminate 22 having a nip structure and the nickel layer 24 are formed by continuous CVD. As shown in FIG. 2D, in the fourth plasma processing apparatus, the $n^+$-type a-Si layer 221, the i-type a-Si layer 222, the $p^+$-type a-Si layer 223, and the nickel layer 24 are sequentially formed. Specifically, in the fourth plasma processing apparatus, a mixed gas of Ar and $H_2$ is supplied from the upper gas nozzle to the chamber to generate a plasma and a mixed gas of Ar, $SiH_4$, and $PH_3$ is introduced from the lower gas nozzle or the lower gas shower plate into the chamber to form the $n^+$-type a-Si layer 221 by plasma CVD. Next, the mixed gas of Ar and $H_2$ is continuously supplied from the upper gas nozzle to the chamber to generate a plasma, while the gas from the lower gas nozzle or the lower gas shower plate is changed from the Ar, $SiH_4$, and $PH_3$ gas to an $Ar^+SiH_4$ gas which is then introduced. Thus, the i-type a-Si layer 222 is formed. Further, the mixed gas of Ar and $H_2$ is continuously supplied from the upper gas nozzle to the chamber to generate a plasma, while the gas from the lower gas nozzle or the lower gas shower plate is changed from the Ar and $SiH_4$ gas to an $Ar^+SiH_4^+B_2H_6$ gas. Thus, the $p^+$-type a-Si layer 223 is formed. Next, the mixed gas of Ar and $H_2$ is continuously supplied from the upper gas nozzle to the chamber to generate a plasma, while the gas from the lower gas nozzle or the lower gas shower plate is changed from the Ar, $SiH_4$, $B_2H_6$ gas to a mixed gas of Ar and Ni. Thus, the nickel layer 24 is formed by CVD. As described above, in the same MSEP type plasma processing apparatus, the introduced gases are sequentially changed so that the six layers are formed and etched. Therefore, it is possible to form an excellent film with reduced defects and, at the same time, to substantially reduce a manufacturing cost.

The glass substrate 14 with the nickel layer 24 and the power generation laminate 22 mounted thereon is introduced from the fourth plasma processing apparatus into a photoresist coater (slit coater) and applied with a photoresist. Thereafter, the photoresist is patterned by a photolithography technique.

Figure 2E:
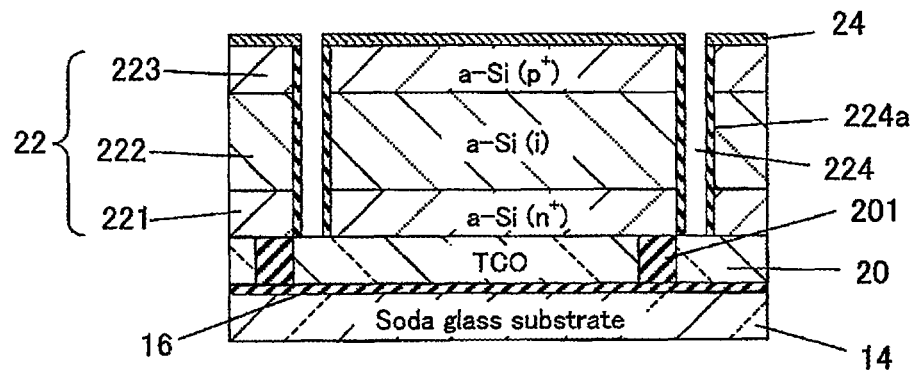
FIG. 2E is a view for describing the manufacturing method of the photoelectric conversion element 10.

After the photoresist is patterned, the glass substrate 14 with the nickel layer 24 and the power generation laminate 22 mounted thereon is introduced, together with the patterned photoresist, into the fifth plasma processing apparatus provided with the lower gas nozzle or the lower gas shower plate. In the fifth plasma processing apparatus, the nickel layer 24 and the power generation laminate 22 are selectively etched using the photoresist as a mask to form the via holes 224 reaching the first electrode layer 20 as shown in FIG. 2E. Thus, the four layers are sequentially etched in the fifth plasma processing apparatus.

Specifically, the nickel layer 24 is etched by supplying a mixed gas of Ar and $H_2$ from the upper gas nozzle to the chamber to generate a plasma, while a mixed gas of Ar and $CH_4$ is jetted from the lower gas nozzle or the lower gas shower plate into the plasma. Subsequently, Ar is continuously supplied from the upper gas nozzle to the chamber to generate a plasma, while an $Ar^+HBr$ gas is jetted from the lower gas nozzle or the lower gas shower plate. Thus, the power generation laminate 22 comprising three layers of nip is etched.

By etching in the fifth plasma processing apparatus, the glass substrate 14 is provided with the via holes 224 which penetrate through those layers from the nickel layer 24 to the $n^+$-type ZnO layer (first electrode layer 20) to reach the first electrode layer 20. The glass substrate is transferred from the fifth plasma processing apparatus to the above-mentioned third plasma processing apparatus without the lower gas nozzle or the lower gas shower plate. Then, the photoresist is removed by ashing in the plasma generated in the atmosphere of the $Kr/O_2$ gas introduced from the upper gas nozzle into the chamber.

Figure 2F:
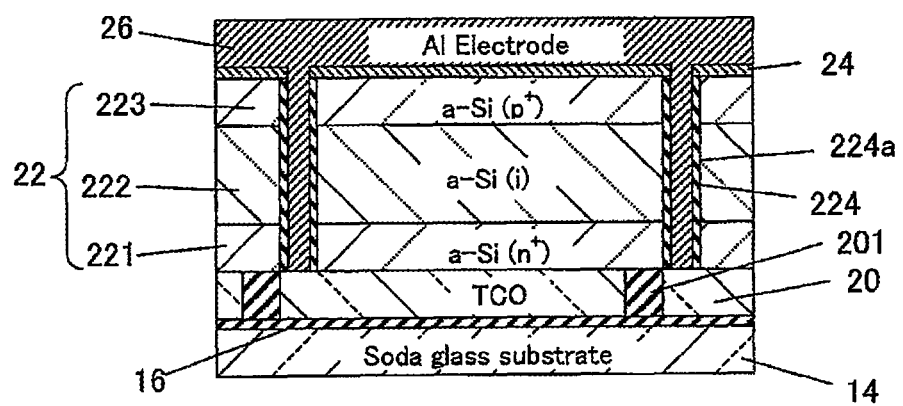
FIG. 2F is a view for describing the manufacturing method of the photoelectric conversion element 10.

The glass substrate 14 after the photoresist is removed is transferred to the sixth plasma processing apparatus provided with the lower gas nozzle or the lower gas shower plate. As shown in FIG. 2F, an Al layer having a thickness of 1 μm is formed as the second electrode layer 26 on the nickel layer 24. The Al layer is formed also in the via holes 224. Formation of the Al layer is performed by supplying a mixed gas of Ar and $H_2$ from the upper gas nozzle to the chamber to generate a plasma, while an $Ar^+Al(CH_3)_3$ gas is jetted from the lower gas nozzle or the lower gas shower plate into the plasma generated in an $Ar/H_2$ atmosphere.

Subsequently, on the Al layer as the second electrode layer 26, a photoresist is applied. Thereafter, patterning is performed. Then, the glass substrate is introduced into the seventh plasma processing apparatus provided with the lower gas nozzle or the lower gas shower plate.

Figure 2G:
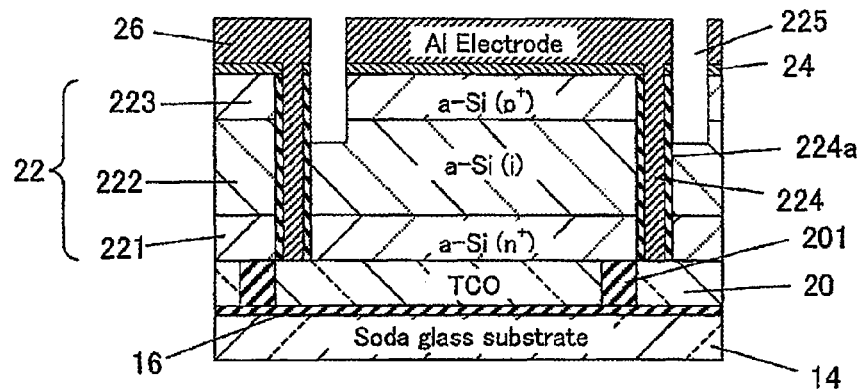
FIG. 2G is a view for describing the manufacturing method of the photoelectric conversion element 10.

In the seventh plasma processing apparatus, an Ar gas is supplied from the upper gas nozzle to the chamber to generate a plasma, while an $Ar^+Cl_2$ gas is jetted from the lower gas nozzle or the lower gas shower plate into the plasma generated in an Ar atmosphere to etch the Al layer. Subsequently, a mixed gas of Ar and $H_2$ is supplied from the upper gas nozzle to the chamber to generate a plasma, while an $Ar^+CH_4$ gas is introduced from the lower gas nozzle or the lower gas shower plate into the plasma generated in an $Ar/H_2$ atmosphere to etch the nickel layer 24. Next, an Ar gas is supplied from the upper gas nozzle to the chamber to generate a plasma, while the gas from the lower gas nozzle or the lower gas shower plate is changed to an $Ar^+HBr$ gas to etch the $p^+$-type a-Si layer 223 and a part of the i-type a-Si layer 222 to its middle. As a result, as shown in FIG. 2G, the holes 225 are formed which extend from a surface of the Al layer (second electrode layer 26) and reach the middle of the i-type a-Si layer 222. Also in this process, using the same MSEP type plasma processing apparatus and by sequentially changing gases, the four layers are consecutively etched. Therefore, substantial reduction in processing time and cost is achieved.

Next, the glass substrate 14 with the element illustrated in FIG. 2G mounted thereon is transferred to the above-mentioned third plasma processing apparatus without the lower gas nozzle or the lower gas shower plate. Then, the photoresist is removed by ashing by the plasma generated in an atmosphere of a $Kr/O_2$ gas introduced from the upper gas nozzle into the chamber.

Figure 2H:
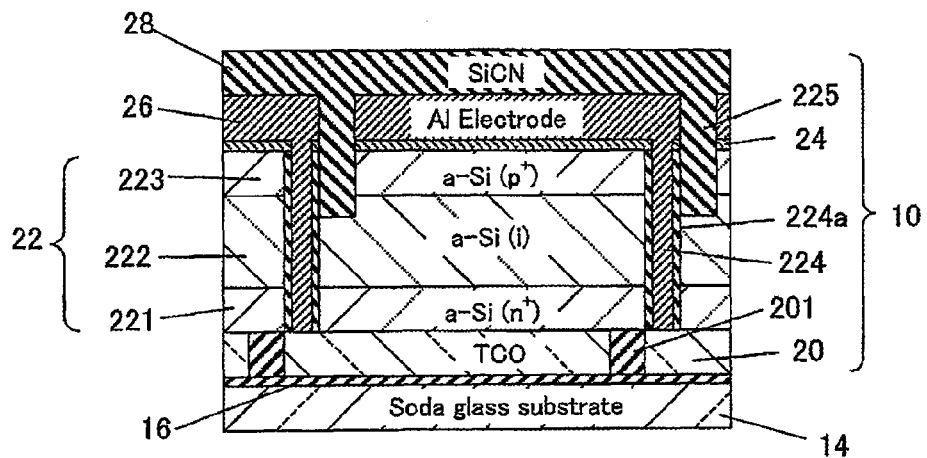
FIG. 2H is a view for describing the manufacturing method of the photoelectric conversion element 10.

The glass substrate 14 including, as the second electrode layer 26, the Al layer from which the photoresist is removed is introduced into the eighth plasma processing apparatus provided with the lower gas nozzle or the lower gas shower plate. Then, a SiCN film is formed by CVD to form the passivation layer 28 on the Al layer (second electrode layer 26) and in the holes 225. Thus, the photoelectric conversion element 10 as desired is completed as shown in FIG. 2H. The film formation of SiCN is performed by supplying Xe and NH$_3$ gases from the upper gas nozzle into the chamber to generate a plasma and jetting Ar, SiH$_4$, and SiH(CH$_3$)$_3$ gases from the lower gas nozzle or the lower gas shower plate.

Figure 3:
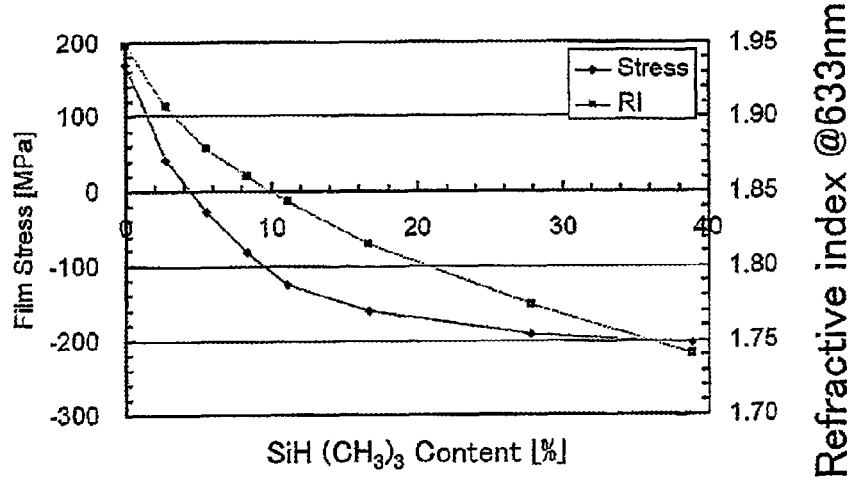
FIG. 3 is a view showing a relationship between conditions in forming a passivation layer 28 and a physical property of the passivation layer 28 which has been formed.

It is noted here that an internal stress of the SiCN film can be reduced to substantially zero, for example, by adjusting a concentration of the SiH(CH$_3$)$_3$ gas (i.e., by adjusting a C content in the film) as shown in FIG. 3. Herein, as a composition of SiCN, silicon nitride Si$_3$N$_4$ with C contained therein (added thereto) in an amount slightly smaller than 10 at % is the best. However, 2 at % to 40 at % may be added.

Further, the glass substrate 14 is fixed on the guard glass 12 and the heat sink 30 is mounted on the passivation layer 28 through the adhesive layer 29 described above. Thus, the photoelectric conversion device 1 is completed.

As described above, according to the present embodiment, the photoelectric conversion device 1 is provided with the passivation layer 28 constructed of a material containing SiCN and formed on the second electrode layer 26 on the side of the heat sink 30.

That is, the photoelectric conversion device 1 has the passivation layer suitable for a structure provided with a heat dissipation mechanism and contributes to further improvement in power generation efficiency and weather resistance.

INDUSTRIAL APPLICABILITY

In the foregoing embodiment, description has been made only about the case where the entire power generation laminate 22 of a nip structure is formed of the a-Si layers. However, the i-type a-Si layer may be replaced by crystalline silicon or microcrystalline amorphous silicon, or a monocrystalline Si layer. Additionally, one or more power generation laminates may be deposited on the power generation laminate 22.

DESCRIPTION OF REFERENCE NUMERALS

1 photoelectric conversion device
10 photoelectric conversion element
12 guard glass
14 glass substrate
16 sodium barrier layer
20 first electrode layer (n$^+$-type ZnO layer)
22 power generation laminate
100 base member
221 n$^+$-type a-Si layer
222 i-type a-Si layer
223 p$^+$-type a-Si layer
24 nickel layer (Ni layer)
26 second electrode layer (Al layer)
28 passivation layer (SiCN layer)
201 insulating layer (SiCN layer)
224 via hole
224a SiO$_2$ layer
30 heat sink

The invention claimed is:

1. A photoelectric conversion device comprising:
   a first electrode layer;
   a second electrode layer including Al;
   one or a plurality of power generation laminates provided between the first and the second electrode layers, for converting an energy of incident light into an electric energy;
   a heat dissipation portion including Al provided to the second electrode layer; and
   a passivation layer provided between the heat dissipation portion and the second electrode layer in a portion brought into contact with the heat dissipation portion and the second electrode layer, and constructed of a material containing SiCN having a composition of Carbon added thereto in an amount of 2 at % to 10 at %.

2. The photoelectric conversion device as claimed in claim 1, wherein:
   the power generation laminate including a p-type semiconductor layer, an i-type semiconductor layer formed in contact with the p-type semiconductor layer, and an n-type semiconductor layer formed in contact with the i-type semiconductor layer.

3. The photoelectric conversion device as claimed in claim 2, wherein the first electrode layer is a transparent electrode.

4. The photoelectric conversion device as claimed in claim 2, wherein the i-type semiconductor layer of the power generation laminate is formed of any one of crystalline silicon, microcrystalline amorphous silicon, and amorphous silicon.

5. The photoelectric conversion device as claimed in claim 2, wherein the first electrode layer has a portion which is brought into contact with the n-type semiconductor layer and which contains n-type ZnO, the n-type semiconductor layer brought into contact with the first electrode layer being formed of amorphous silicon.

6. The photoelectric conversion device as claimed in claim 2, wherein the p-type semiconductor layer brought into contact with the second electrode layer is formed of amorphous silicon, the second electrode layer being provided with a layer containing nickel (Ni) at least in a portion brought into contact with the p-type semiconductor layer.

7. The photoelectric conversion device as claimed in claim 1, wherein the heat dissipation portion is a heat sink constructed of a material containing Al.

* * * * *